United States Patent

[19]

Lin et al.

[11] Patent Number: 6,136,613

[45] Date of Patent: Oct. 24, 2000

[54] METHOD FOR RECYCLING MONITORING CONTROL WAFERS

[75] Inventors: Jen-Tsung Lin, Taichung; Tsung-Hsien Han, Taipei; Tang Yu, Hsinchu Hsien, all of Taiwan

[73] Assignee: United Silicon Incorporated, Hsinchu, Taiwan

[21] Appl. No.: 09/082,659

[22] Filed: May 21, 1998

[30] Foreign Application Priority Data

Apr. 21, 1998 [TW] Taiwan ................................. 87106063

[51] Int. Cl.[7] .................................................. H01J 37/317
[52] U.S. Cl. ...................................... 438/4; 438/5; 438/10; 438/14; 438/17; 134/1.3; 134/902
[58] Field of Search .................................. 438/5, 10, 14, 438/17, 4; 134/1.2, 1.3, 902

[56] References Cited

U.S. PATENT DOCUMENTS

| | | |
|---|---|---|
| 4,755,049 | 7/1988 | Bomback et al. .................... 356/30 |
| 4,799,392 | 1/1989 | Wilson et al. ....................... 73/865.9 |
| 5,451,529 | 9/1995 | Hsu et al. ................................. 437/8 |
| 5,711,848 | 1/1998 | Iturralde ................................. 438/14 |
| 5,861,632 | 1/1999 | Rohner ............................. 250/492.21 |
| 5,908,509 | 6/1999 | Olesen et al. .......................... 134/1.3 |
| 5,950,645 | 9/1999 | Olesen et al. ......................... 134/98.1 |

Primary Examiner—Mary Wilczewski
Assistant Examiner—Yung A. Lin
Attorney, Agent, or Firm—Christie, Parker & Hale, LLP

[57] ABSTRACT

A method for recycling monitoring control wafers includes cleaning the wafers after performing a sheet resistance (Rs) measurement on a bare silicon monitoring control wafer of an ion implanter, and then converting the wafer into a recyclable control wafer. A recyclable control wafer for a thermal wave (TW) measurement of destruction can be obtained by forming a screen layer on the wafer, performing a TW measurement, performing ion implantation by the monitoring recipe, performing TW measurement again, performing ion drive-in to drive implanted ions into the deeper areas of the substrate, removing the screen layer, and then forming another screen layer on the wafer to put the wafer into the recycling process of a TW measurement.

8 Claims, 2 Drawing Sheets

METHOD FOR RECYCLING MONITORING CONTROL WAFERS

CROSS-REFERENCE TO RELATED APPLICATION

This application claims the priority benefit of Taiwan application Ser. No. 87106063, filed Apr. 21, 1998, the full disclosure of which is incorporated herein by reference.

BACKGROUND OF THE INVENTION

1. Field of the Invention

This invention relates to a method for recycling monitoring control wafers, and more particularly, to a method for recycling monitoring control wafers used in an ion implanter.

2. Description of Related Art

During a semiconductor fabrication process, an ion implanter needs to be monitored periodically by a monitoring recipe to ensure that the ion implanter is functioning steadily.

Currently, there are two kinds of monitoring control wafers used in a medium-low current ion implanter. One is a bare silicon monitoring control wafer and the other is a monitoring control wafer with a screen layer. The process of using a bare silicon monitoring control wafer, using the measured sheet resistance (Rs) as the monitored target, in an ion implantation process is shown in FIG. 1. The monitoring process starts with taking a blank wafer and performing an ion implantation process by a monitoring recipe, then performing an annealing process such as a rapid thermal process (RTP), and then measuring the Rs. Measuring Rs is a destructive measurement because the measuring probe has to make contact with the surface of the control wafer. As a result, the only use for a measured bare silicon monitoring control wafer is as a dummy wafer. It can also be destroyed.

The other kind of control wafer is a control wafer with a screen layer and is used in an ion implantation process. The process of recycling the wafer that uses the measured thermal wave (TW) as the monitored target is shown in FIG. 2. The monitoring process starts with forming a screen layer on a control wafer, then measuring the TW value after performing an ion implantation process by a monitoring recipe, driving in implanted ions into the deeper areas of the screen layer, and then removing the screen layer and cleaning the control wafer. The control wafer can be reused as a recycled control wafer after forming a new screen layer on it.

Since the number of new bare silicon control wafers used for monitoring Rs is quite large in a fabrication line employing ion implanters, the cost is too high if these wafers are just treated as dummy wafers or destroyed after an implantation process.

Currently, a brand-new bare silicon wafer is still initially used as the control wafer in the process of monitoring TW value. The process starts with forming a screen layer on a brand-new bare silicon wafer, measuring the TW value after performing an implantation process, and then performing a recycling process, so that a certain cost is still required.

SUMMARY OF THE INVENTION

It is therefore an objective of the present invention to provide a method for converting a used monitoring control wafer, after the implantation process and the measurement of Rs, into a control wafer that can be used in another monitoring process, such as foregoing TW monitoring process. That is, combining two monitoring methods that use the same wafer can reduce costs and use wafers more efficiently.

It is another an objective of the present invention to reuse the wafer recycled after the Rs monitoring process as a control wafer in the process that uses TW as the monitoring target. Because the recycled wafer has already been through an annealing process similar to an implantation process, the wafer then can be used in a TW monitoring process without an ion driving-in process, after the Rs monitoring process.

In accordance with the foregoing and other objectives of the present invention, the present invention provides a method for recycling control wafers used in ion implanters after the Rs measurement. The method includes cleaning used wafers and converting the used wafers into recyclable monitoring wafers, such as control wafers, for measuring TW values.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
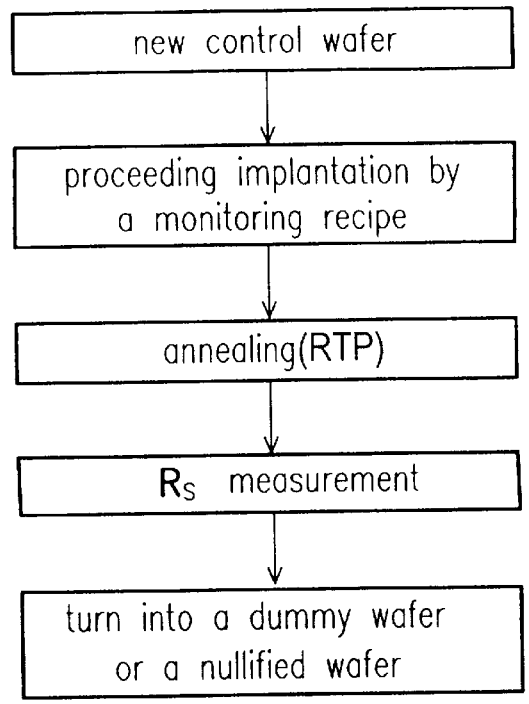
FIG. 1 is a flow chart showing the usage of control wafers in a conventional monitoring process using the measured Rs as the monitored target.
Figure 2:
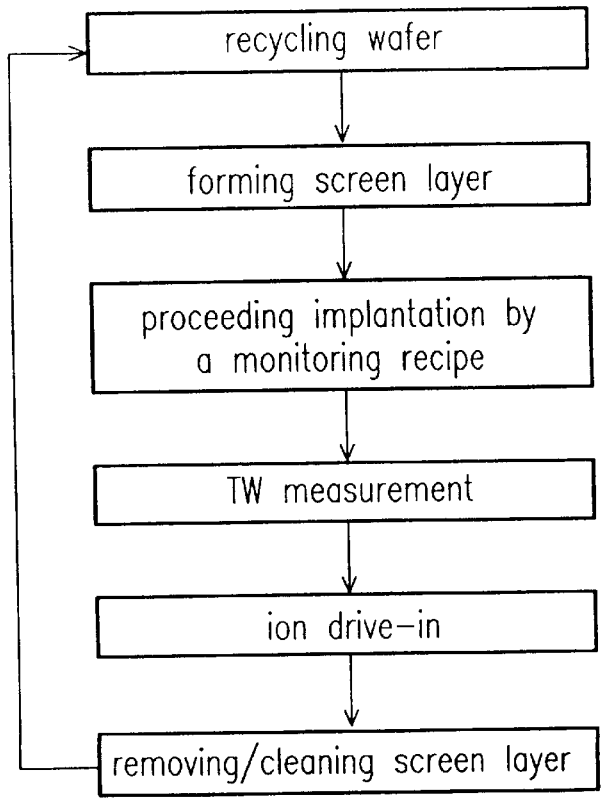
FIG. 2 is a flow chart showing the usage of control wafers in a conventional monitoring process using the measured TW as the monitored target.
Figure 3:
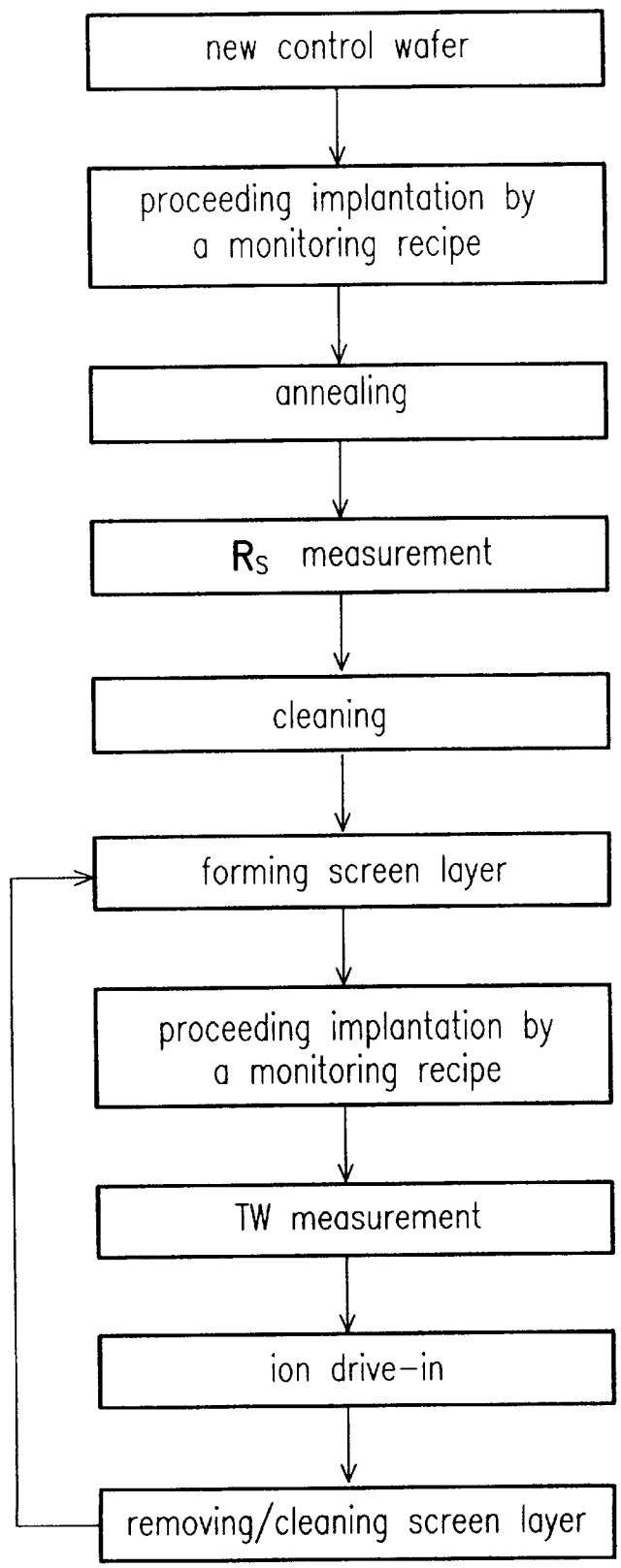
FIG. 3 is a flow chart showing the method for recycling control wafers.

The invention provides a new method for recycling a monitoring control wafer. Initially, the wafer is new and is used for the monitoring process of measuring Rs in a medium-low ion implanter. Then it is recycled and reused as a control wafer for the monitoring process of measuring TW. FIG. 3 is a flow chart indicating the method according to the invention.

First, a monitoring recipe is executed to perform the ion implantation process on a brand-new control wafer, measure the Rs value after performing an annealing process, and then clean the control wafer in a recycling process. A screen layer is formed on the cleaned wafer, and then the monitoring recipe performs the ion implantation process on the screen layer, measures TW value, drives implanted ions into the deep areas of the substrate, and then removes the screen layer and cleans the surface of the wafer. The cleaned wafer can be reused as a recyclable control wafer for monitoring the TW value after forming a new screen layer on it.

Since the measurement of TW value uses the detected damage caused by the ion implantation process to reflect the status of implantation, a destroyed portion caused by the destructive Rs measurement on the control wafer might possibly interfere with the measurement of TW, as described in the following embodiment.

First, five batches of used control wafers are collected, each batch containing 25 recycled wafers which have already been used for measuring Rs values. The wafers are cleaned and an oxide layer is formed as a screen layer on the wafers. Then, a monitoring recipe, BF2, for an ion implanter (energy:60 KeV, dose:1.0e13) is selected as the implantation condition to perform an ion implantation process on the recycled control wafer, and measures the TW values. The averages and standard deviations (STDEV) of the TW values measured on the recycled control wafers and those of regular control wafers are listed in Table 1 (1) as a comparison:

TABLE 1 (1)

| Recycling Times | Items | 1 | 2 | 3 | 4 | 5 |
|---|---|---|---|---|---|---|
| One | Average of TW value over 25 recycled wafers | 792.3 | 791.9 | 790.4 | 796.1 | 792.6 |
| | STDEV | 2.6 | 1.63 | 1.92 | 1.53 | 1.16 |
| | STDEV (%) | 0.33 | 0.21 | 0.24 | 0.19 | 0.15 |
| | Average over regular wafers | 794.2 | 789.2 | 792.1 | 796 | 794.4 |

The averages and STDEVs indicate that the measured TW values on recycled control wafers are not affected by the previously performed destructive Rs measurement. Since implantation processes are not performed on wafers at the same time, the differences between batches should be caused by the implanter but this should not affect the quality of the recycled control wafers. The differences between different batches of regular control wafers totally supports the foregoing assumption.

In order to ensure the stability of the wafers after several recycling episodes, and to collect more data to support the practicability of this invention, the TW values measured on implanted wafers that have been recycled three and five times are listed in

TABLE 1 (2)

| Recycling Times | Items | 1 | 2 | 3 | 4 | 5 |
|---|---|---|---|---|---|---|
| Three | Average of TW value over 25 recycled wafers | 793 | 795 | 795.9 | 792.6 | 790.7 |
| | STDEV | 2.9 | 2.9 | 2.3 | 2.5 | 1.3 |
| | STDEV (%) | 0.36 | 0.35 | 0.29 | 0.32 | 0.17 |
| | Average over regular wafers | 793.6 | 794.8 | 795.1 | 794.2 | 790.7 |
| Five | Average of TW value over 25 recycled wafers | 799.0 | 798.5 | 799.4 | 798.1 | 795.6 |
| | STDEV | 1.1 | 2.4 | 1.4 | 1.3 | 1.0 |
| | STDEV (%) | 0.13 | 0.31 | 0.18 | 0.16 | 0.13 |
| | Average over regular wafers | 798.3 | 798.3 | 798.3 | 798.3 | 798.3 |

Although the Rs measurement is a destructive measurement, the actual area destroyed is very small and the laser spot size of the TP series is also very small, so the damaged area on the wafer caused by Rs measurement doesn't really affect the following TW measurement.

According to the foregoing embodiment, the control wafers recycled through the recycling flow according to this invention are not different from the conventional recycled control wafers. It is obvious that as the number of times Rs and TW measurements are performed on a control wafer increases, the probability of affecting the TW measurement by the destructive Rs measurement increases. However, according to the consideration in the representation of the throughput and the number of measured points, the quality of recycled control wafers are able to meet requirements without affecting the measurement under a condition of 125 points per wafer.

Funnel and RTP can both be used to perform the ion drive-in process, wherein RTP can shorten the flow and recycling time, and further can prevent a funnel, which requires higher cleanliness, from being polluted by doped wafers.

The screen layer used in this invention includes an oxide layer. In fact, as long as the reflection index of the screen layer is actually known, the TW value of the silicon substrate can be measured without problems. Hence, the material used as the screen layer in this invention is not limited to oxide only; the screen layer includes any material of a actually known reflection index.

It has been proved through experiment that the annealing process can drive in the implanted ions, and that the destructive Rs measurement doesn't affect the TW measurement on recycled wafers. Therefore, a bare silicon control wafer can be directly cleaned after the annealing process, and then have a screen layer formed on it for processing TW monitor procedure. This can not only eliminate an ion drive-in process, but can also increase the usage efficiency of the monitoring control wafers. The dose of cumulated implanted ions on the silicon substrate should be limited under 5E14 atoms/cm$^2$ to ensure the quality of recycled wafers.

The invention has been described using exemplary preferred embodiments. However, it is to be understood that the scope of the invention is not limited to the disclosed embodiments. On the contrary, it is intended that they cover various modifications and similar arrangements. The scope of the claims, therefore, should be accorded the broadest interpretation so as to encompass all such modifications and similar arrangements.

What is claimed is:

1. A method for recycling monitoring control wafers comprising:

providing a bare silicon control wafer for performing an ion implantation process by a monitoring recipe;

performing an annealing process and a destructive measurement on the wafer;

cleaning the wafer and forming a screen layer on the wafer;

measuring damages caused by the destructive measurement on the wafer;

performing an ion drive-in process; and removing the screen layer.

2. The method of claim 1, wherein the screen layer includes an oxide layer.

3. The method of claim 1, wherein the ion drive-in process includes a rapid thermal process (RTP).

4. The method of claim 1, wherein the ion drive-in process includes a furnace process.

5. The method of claim 1, wherein the measurement of destruction includes a thermal wave measurement.

6. The method of claim 1, wherein the destructive measurement includes a Rs measurement.

7. The method of claim 1, wherein the annealing process includes a rapid thermal process.

8. The method of claim 1, wherein the annealing includes a furnace process.

* * * * *